US007325732B2

(12) United States Patent
Wojdyla et al.

(10) Patent No.: US 7,325,732 B2
(45) Date of Patent: Feb. 5, 2008

(54) METHOD AND SYSTEM FOR MAIL SECURITY AND TRACEABILITY

(75) Inventors: Richard Wojdyla, Wadsworth, IL (US); David Schwaba, Chicago, IL (US)

(73) Assignee: Bowe Bell + Howell Postal Systems Company, Lincolnwood, IL (US)

( * ) Notice: Subject to any disclaimer, the term of this patent is extended or adjusted under 35 U.S.C. 154(b) by 87 days.

(21) Appl. No.: 10/007,690

(22) Filed: Dec. 4, 2001

(65) Prior Publication Data

US 2003/0102374 A1 Jun. 5, 2003

(51) Int. Cl.
*G06F 19/00* (2006.01)
*G06F 30/00* (2006.01)
*G06F 90/00* (2006.01)

(52) U.S. Cl. ...................................... 235/385; 705/401

(58) Field of Classification Search ................ 235/385, 235/375, 376, 462.01, 462.02; 705/401, 705/404, 410, 406
See application file for complete search history.

(56) References Cited

U.S. PATENT DOCUMENTS 4,829,568 A * 5/1989 Clark et al. .................... 705/62
4,947,333 A * 8/1990 Sansone et al. ............. 705/403
4,997,337 A * 3/1991 Trimble ................... 414/790.4
5,291,002 A * 3/1994 Agnew et al. .............. 235/375
5,390,251 A * 2/1995 Pastor et al. .................. 705/62
5,586,036 A * 12/1996 Pintsov ...................... 705/408
5,612,889 A * 3/1997 Pintsov et al. .............. 700/226
5,726,897 A * 3/1998 Tammi et al. .............. 705/408
5,745,590 A * 4/1998 Pollard ....................... 382/101
5,768,132 A * 6/1998 Cordery et al. ............. 705/410
5,826,247 A * 10/1998 Pintsov et al. ............. 705/404
5,912,682 A * 6/1999 Parkos ........................ 347/40
5,918,802 A * 7/1999 Petkovsek ................... 229/300
5,925,864 A * 7/1999 Sansone et al. ............. 235/375
5,929,415 A * 7/1999 Berson ....................... 235/382
6,003,010 A * 12/1999 Scolly et al. ............... 705/407

(Continued)

FOREIGN PATENT DOCUMENTS

CA 2 164 787 9/1997

(Continued)

OTHER PUBLICATIONS

EPO Communication issued in EP 02 258 362.9, dated Apr. 28, 2006.

(Continued)

*Primary Examiner*—Uyen-Chau N Le
(74) *Attorney, Agent, or Firm*—McDermott Will & Emery LLP

(57) ABSTRACT

A method and system for mail security and traceability is disclosed. Identification code producing equipment prints an encrypted code which identifies the source of the individual mail piece on each mail piece in a batch of mail. When the mailer submits the mailing to the Postal service, recording equipment captures and records the identity of the person submitting the mail. Verification equipment samples the batch of mail and reads the identification code on each mail piece in the sample. Paperwork submitted with the mailing also contains an encrypted code which is scanned and compared to the identification code on the mail pieces to verify the origin of the mailing. Any mail piece that does not have a mark or that has the wrong code is rejected.

25 Claims, 3 Drawing Sheets

U.S. PATENT DOCUMENTS

| | | | | |
|---|---|---|---|---|
| 6,009,416 | A * | 12/1999 | Pintsov | 705/410 |
| 6,039,257 | A * | 3/2000 | Berson et al. | 235/468 |
| 6,073,125 | A * | 6/2000 | Cordery et al. | 705/401 |
| 6,311,892 | B1 * | 11/2001 | O'Callaghan et al. | 235/375 |
| 6,400,829 | B1 * | 6/2002 | Petkovsek | 235/375 |
| 6,430,543 | B1 * | 8/2002 | Lee et al. | 705/404 |
| 6,510,992 | B2 * | 1/2003 | Wells et al. | 235/385 |
| 6,557,755 | B1 * | 5/2003 | Pickering et al. | 235/376 |
| 6,701,215 | B1 * | 3/2004 | Stadermann | 700/225 |
| 6,834,273 | B1 * | 12/2004 | Sansone et al. | 705/410 |
| 2002/0046196 | A1 * | 4/2002 | Ogg | 705/406 |
| 2003/0028497 | A1 * | 2/2003 | Leon | 705/408 |
| 2003/0085266 | A1 * | 5/2003 | Simon | 232/27 |
| 2003/0089765 | A1 * | 5/2003 | Kovlakas | 235/375 |
| 2003/0101148 | A1 * | 5/2003 | Montgomery et al. | 705/404 |
| 2003/0136826 | A1 * | 7/2003 | Turner | 235/494 |
| 2007/0022060 | A1 * | 1/2007 | Fitzsimmons | 705/402 |

FOREIGN PATENT DOCUMENTS

| | | | |
|---|---|---|---|
| CA | 2290054 | | 5/2000 |
| JP | 2002355613 | A * | 12/2002 |
| JP | 2003335393 | A * | 11/2003 |
| WO | WO 2001/086579 | | 11/2001 |

OTHER PUBLICATIONS

EPO Communication issued in EP Appln. No. 02 258 362.9 - 2221, dated Jul. 17, 2006 (Decision).

EPO Communication issued in EP Appln. No. 02 258 362.9 - 2221 dated Jul. 17, 2006 (Minutes).

* cited by examiner

METHOD AND SYSTEM FOR MAIL SECURITY AND TRACEABILITY

The present invention relates to mail processing, and in particular to a method and system for use in mail processing which provides for the security and traceability of mail. Specifically, the present invention relates to a method and system for proving an identification code on mail pieces which uniquely identifies at least the source of the mail piece, such that the mail piece can be verified, and traced back to its source when desired.

BACKGROUND OF THE INVENTION

The threat of bio-terrorism via the mail is a real and present danger. In the instances where a mail piece has been contaminated with any harmful substance and then processed through the mail, it is often a difficult task to attempt to identify the origin of that mail piece. Typically, such mail pieces can only be traced back, via a postmark, to the postal facility where it had been processed.

Accordingly, there is a growing need to increase the level of security associated with mail submittal. There is also a growing need to be able to trace a mail piece back to its source. The present invention fulfills such needs.

BRIEF SUMMARY OF THE INVENTION

The present invention comprises a method and system for providing an identification code on mail pieces which uniquely identifies at least the source of the mail piece, such that the mail piece can be verified, and traced back to its source when desired. An identification coding device produces the identification code on the mail piece. This identification code is read during the processing of the mail pieces, and the information provided therefrom is compared to known information with respect to the submitter to verify compatibility. If the mail piece contains inconsistent information in the identification code, or if the identification code is missing, the present invention would alert the mail processor that such mail piece is suspicious and needs to be investigated further before delivery. If a contaminated mail piece having the present invention's identification code is not detected prior to delivery, then the mail piece could easily be traced to its source at a later date by reading the identification code. The identification code is preferably encrypted so that it cannot be imitated.

Accordingly, it is the principal object of the present invention to provide an increased level of security associated with mail submittal.

It is a further object of the present invention to provide a method and system for mail traceability.

It is also an object of the invention to provide a device for producing an encrypted identification code on a mail piece.

Numerous other advantages and features of the invention will become readily apparent from the detailed description of the preferred embodiment of the invention, from the claims and from the accompanying drawings in which like numerals are employed to designate like parts throughout the same.

BRIEF DESCRIPTION OF THE DRAWINGS

A fuller understanding of the foregoing may be had by reference to the accompanying drawings wherein.

DETAILED DESCRIPTION OF THE PREFERRED EMBODIMENTS OF THE PRESENT INVENTION

Figure 1:
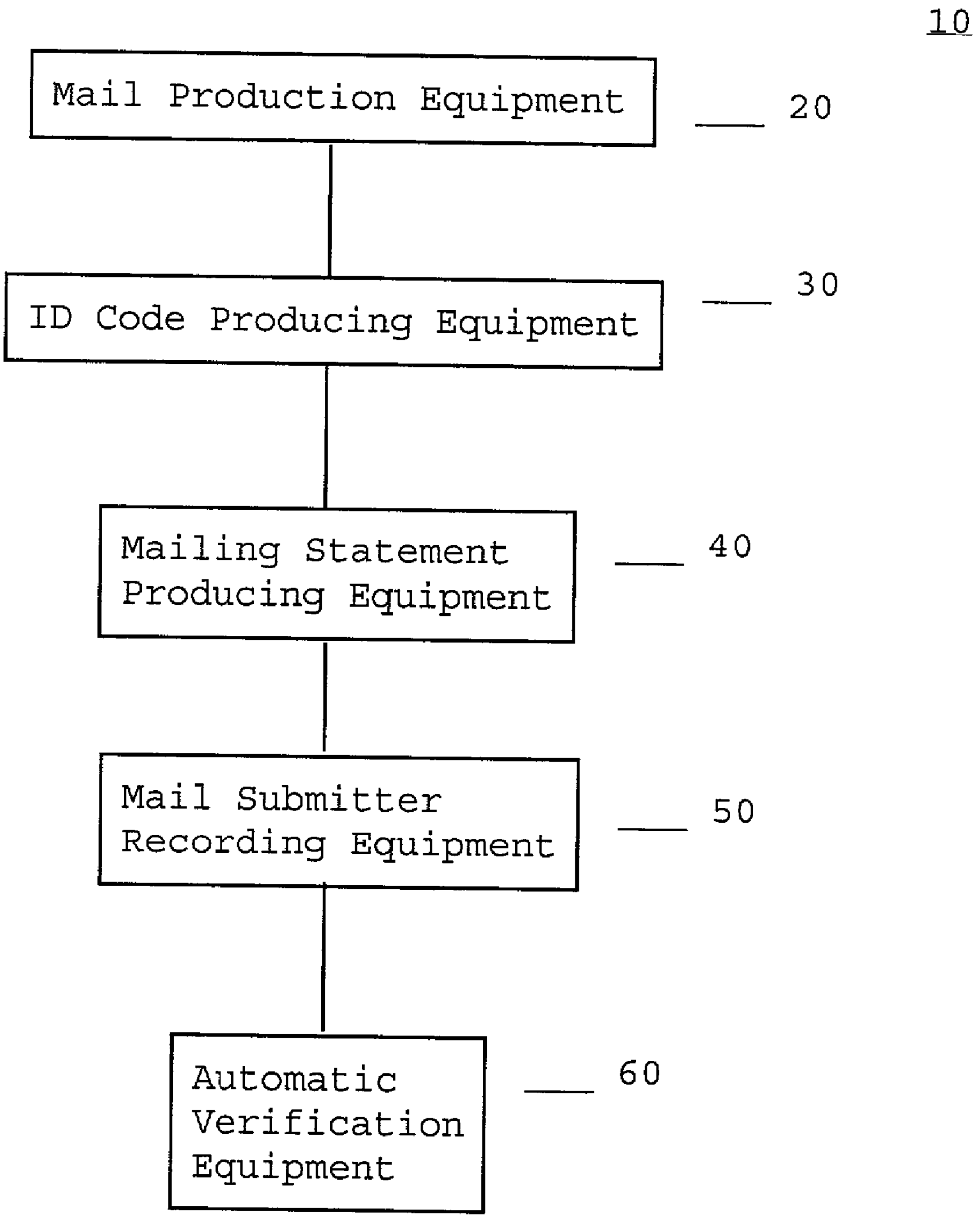
FIG. 1 is a block diagram of the present invention.

While the invention is susceptible of embodiment in many different forms, there is shown in the drawings and will be described herein in detail preferred and alternate embodiments of the present invention. It should be understood, however, that the present disclosure is to be considered an exemplification of the principles of the invention and is not intended to limit the spirit and scope of the invention and/or claims of the embodiment illustrated.

FIG. 1 illustrates generally the present invention 10 wherein a mailer, for example a bulk or business mail producer, produces a batch of mail using mail production equipment 20, such as inserters, sorters and the like. The mail pieces produced or being produced are marked with an encrypted identification code via identification code producing equipment 30. This equipment 30 could be stand alone and set along the mail piece production transport path, or could be mounted to the mailers existing mail production equipment, so long as each mail piece passes through the equipment 30 during or after production.

The identification code can take any suitable form, but preferably is embedded within a picture or text which is marked on the mail pieces via the identification code equipment 30. This mark could take any suitable form, for example, any digital image or text, invisible ink, a watermark, or special paper fibers. The identification code identifies at least the source of the mail piece, and preferably identifies the characteristics of each individual mail piece.

Once the mail pieces are produced and have been marked with an identification code, a mailing statement containing the relevant information pertaining to that batch of mail will be produced via mailing statement producing equipment 40. This equipment 40 will provide an identification code on the mailing statement which corresponds or matches the encrypted identification code on the mail pieces.

After completion of the batch of mail and the mailing statement, the mailer will then submit the batch of mail and the mailing statement to the postal service. Mail submitter recording equipment 50 is provided at the postal facility receiving the submitted batch of mail. This equipment 50 will use an identifying technique to record the identity of the individual who physically submits the batch of mail. For example, the mail submitter recording equipment could encompass one or more of the following: a camera, video equipment, finger printing equipment, retina scan equipment, etc. The identity of the submitter will be captured and recorded to link the mailing with the person delivering it. A background check of this individual could then be made. This acts as a deterrent and for tracking if problem mail pieces are subsequently detected.

Once the batch of mail is submitted, the mail is sampled by running the mail through automatic verification equipment 60, such as that disclosed in U.S. Pat. No. 6,311,892 issued Nov. 6, 2001 to O'Callaghan et al., and assigned to the assignee of the present invention. The entire disclosure of U.S. Pat. No. 6,311,892 is herein incorporated by reference. The verification equipment 60 includes an image capture device or scanner that reads the encrypted code on each mail piece sampled. Similarly, the mailing statement is scanned such that the identification code on the mailing statement is read or received by the verification equipment 60. Equipment 60 then determines whether the identification code on the mailing statement corresponds or matches the encrypted identification code on the mail pieces. If the identification code on any mail piece is missing or does not match that of the mailing statement, then the unmatched mail piece can be flagged as suspicious and rejected.

Figure 2:
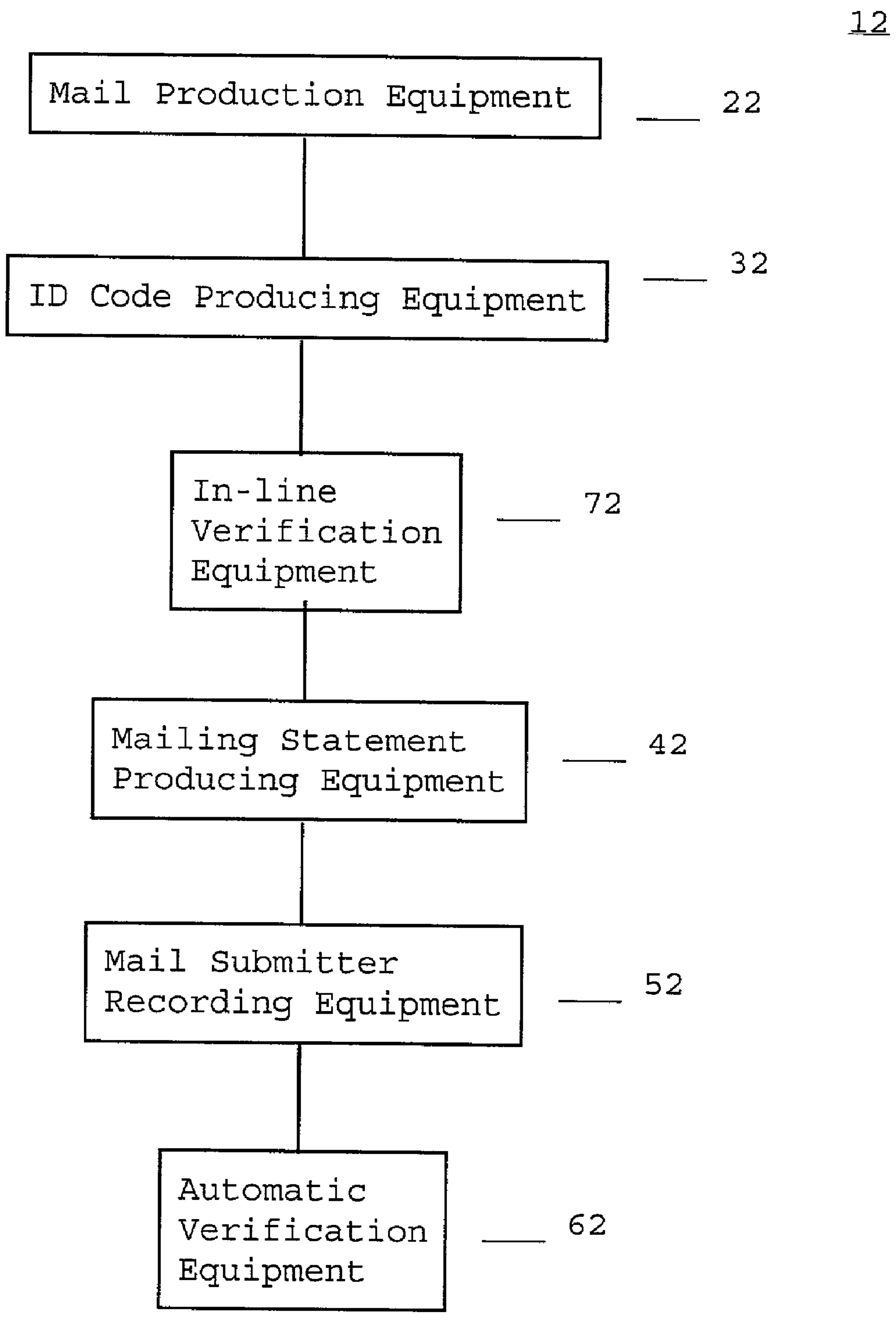
FIG. 2 is a block diagram an alternate embodiment of the present invention.

Referring now to FIG. 2, an alternate embodiment 12 of the present invention is illustrated. As described with respect to FIG. 1, a mailer uses mail production equipment 22 to produce a batch of mail. During production, identification code equipment 32 marks each mail piece with an encrypted identification code. Each mail piece is then verified using in-line verification equipment 72, such as that disclosed in co-pending U.S. patent application Ser. No. 09/774,432 filed Jan. 30, 2001, and assigned to the assignee of the present invention. The entire disclosure of U.S. patent application Ser. No. 09/774,432 is herein incorporated by reference. The verification equipment 72 includes an image capture device or scanner that reads the encrypted code on each mail piece sampled.

Mailing statement producing equipment 42 then produces a mailing statement which includes an identification code corresponding to the identification code on the mail pieces. The batch of mail is next submitted along with the mailing statement to the postal service. Mail submitter recording equipment 52 records the identity of the individual submitting the batch of mail and mailing statement.

If desired, automatic verification equipment 62 can then sample the mail pieces to determine that the identification codes on the mail pieces and the mail statement match. Only a very small sample would be necessary in this embodiment since the mail pieces will already have been verified by the in-line verification equipment 72.

Figure 3:
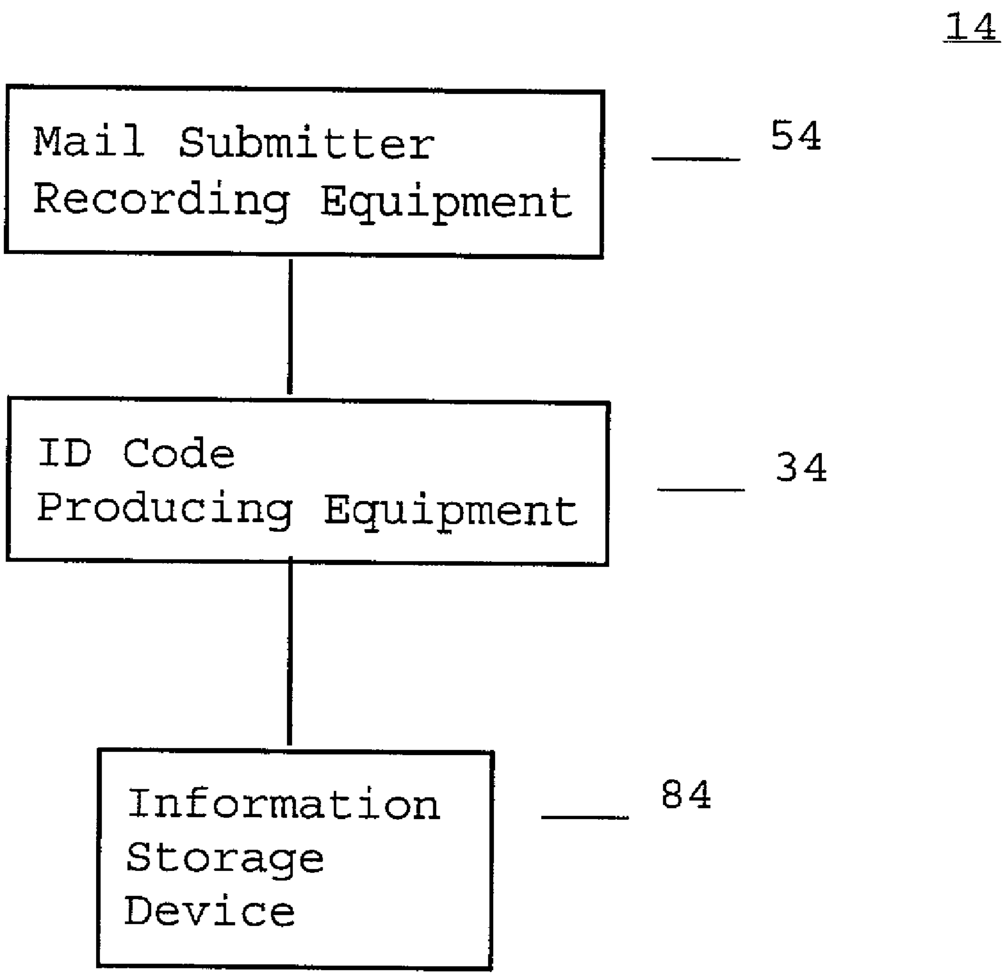
FIG. 3 is a block diagram of another alternate embodiment of the present invention.

Referring now to FIG. 3, another alternate embodiment 14 of the present invention is illustrated. In this embodiment, a mailer creates a batch of mail and submits it to the postal service. Mail submitter recording equipment 54 records the identity of the submitter. The mail is then run through identification code producing equipment 34, which marks each mail piece with a code identifying the source of the mail piece, i.e., the mailer. Information obtained or produced by the mail submitter recording equipment 54 and the identification code producing equipment 34 can be stored in an information storage device 84 for future reference.

It is to be understood that the embodiments herein described are merely illustrative of the principles of the present invention. Various modifications may be made by those skilled in the art without departing from the spirit or scope from the claims which follow. For example, it is foreseen that the present invention, and specifically, that of the alternate embodiment of FIG. 3, can be applicable to not just submitted mail, but also collected mail. For example, metered mail can be collected, scanned to determine the information corresponding to the meter, and marked with an identification code.

Additionally, the present invention is useful for collected mail as well as submitted mail such as bulk or business mail, especially where someone tries to forge or reproduce a marked identification code. For example, someone creates a fake mark on a mail piece and then deposits it in the mail for collection. The mail piece is collected and brought to a postal facility, where the present invention will scan the mail piece to read the mark. Once this mark is read, the present invention will determine or detect that the mark is forged or fake since no valid encrypted code will be found. It should be understood that it would be virtually impossible for someone to forge a valid encrypted code in such an instance. The reading of collected mail pieces having marked identification codes can take place anywhere in the postal facility, via stand alone scanning and verification equipment, or as a component of other postal processing equipment such as sorters, cancellation equipment, etc.

Accordingly, it should be understood that the present invention has application to all types of mail and all types of entities such as bulk mailers, businesses, and individuals.

It is also foreseen that individuals or businesses could securely purchase personalized envelopes having preprinted encrypted identification codes identifying the source and each envelope, which would thus allow deposited and collected mail to be traced back to that individual or business. If lost or stolen, these envelopes could be reported as such. Then, if an unauthorized person used them, the present invention could, after reading the identification code, detect or determine that this is a lost or stolen envelope and reject the same.

What is claimed is:

1. A method for providing traceability of mail pieces, comprising the steps of:
- creating a plurality of mail pieces;
- providing a first source tracing code on each of said plurality of mail pieces, said first source tracing code corresponding to a mail producer;
- creating a mailing statement for said plurality of mail pieces;
- providing a second source tracing code on said mailing statement, said second source tracing code corresponding to the mail producer;
- submitting said plurality of mail pieces and the mailing statement to a postal service facility; and
- verifying that said first source tracing code corresponds to said second source tracing code, such that verified mail pieces can be directly traced back to the mail producer by reading the first source tracing code;
- wherein the mail producer is identified directly by reading the first source tracing code without accessing the mailing statement.

2. The method of claim 1, wherein the step of verifying includes the steps of:
- reading said mailing statement to read said second tracing code; and
- scanning at least a sampling of said plurality of mail pieces to read said first tracing code.

3. The method of claim 2, wherein the first tracing code is independent from a meter imprint, digital postage mark or postal indicia.

4. The method of claim 2, further comprising the step of providing an alert indication when said first tracing code does not correspond to said second tracing code.

5. The method of claim 4, further comprising the step of tracing the first or second tracing code back to the mail producer to determine a reason why the first tracing code does not correspond to the second tracing code.

6. The method of claim 1, wherein the mail pieces define certain characteristics, and wherein said first tracing code further corresponds to the characteristics of the mail pieces, wherein the first tracing code is independent of a meter imprint, digital postage mark or postal indicia.

7. The method of claim 1, wherein said first tracing code is embedded into a digital image, a text, a watermark, paper fibers or invisible ink, independent of a meter imprint digital postage mark or postal indicia.

8. The method of claim 1, wherein the step of providing a first tracing code on each of said plurality of mail pieces includes the step of passing each of said plurality of mail pieces through tracing code producing equipment, independent of a meter.

9. A method for providing traceability of mail pieces, comprising the steps of:

creating a plurality of mail pieces;

providing a first source tracing code on each of said plurality of mail pieces, said first source tracing code corresponding to a mail producer;

creating a mailing statement for said plurality of mail pieces;

providing a second source tracing code on said mailing statement, said second source tracing code corresponding to the first source tracing code;

submitting said plurality of mail pieces and the mailing statement to a postal service facility;

capturing and recording an identity of an individual submitting said plurality of mail pieces and the mailing statement; and storing the first or second source tracing code in association with the recorded identity of the individual;

wherein the identity of the individual submitting the mail pieces and the mail producer are identified directly by reading the first source tracing code without accessing the mailing statement.

10. The method of claim 9, wherein the step of capturing and recording the identity of an individual comprises the step of recording at least one physical characteristic of the individual.

11. A method for providing traceability of mail pieces, comprising the steps of:

creating a plurality of mail pieces via mail production equipment;

providing a source tracing code on each of the plurality of mail pieces via source tracing code producing equipment, the source tracing code corresponding to a creator of the plurality of mail pieces;

scanning each of the plurality of mail pieces to read the source tracing code;

verifying that the source tracing code corresponds to the creator of the mail pieces; and creating a mailing statement for the plurality of mail pieces via mailing statement producing equipment, the mailing statement including a corresponding source tracing code corresponding to the source tracing code on each of the plurality of mail pieces, such that verified mail pieces can be directly traced back to the creator of the mail pieces by reading the source tracing code on the mail pieces;

wherein the creator of the mail pieces is identified directly by reading the source tracing code on the mail pieces without accessing the mailing statement.

12. The method of claim 11, further comprising the steps of:

submitting the plurality of mail pieces and the mailing statement to a postal service facility;

scanning the mailing statement to read the corresponding source tracing code;

scanning at least a sampling of the plurality of mail pieces to read the source tracing code on the mail pieces; and verifying that the source tracing code on the mail pieces corresponds to the corresponding source tracing code.

13. The method of claim 12, further comprising the step of providing an alert indication when the source tracing code on the mail pieces does not correspond to the corresponding source tracing code.

14. The method of claim 13, further comprising the step of tracing the source tracing code or the corresponding source tracing code back to the creator of the mail pieces to determine a reason why the encrypted source tracing code does not correspond to the corresponding source tracing code.

15. The method of claim 11, wherein the source tracing code on the mail pieces is embedded into a digital image, a text, a watermark, paper fibers or invisible ink, independent of a meter imprint, digital postage mark or postal indicia.

16. The method of claim 11, further comprising the steps of capturing and recording the identity of an individual submitting the plurality of mail;

storing the source tracing code on the mail pieces or the corresponding source tracing code in association with the recorded identity of the individual; and subsequently using the source tracing code on the mail pieces or the corresponding source tracing code to trace at least one of the plurality of mail pieces back to at least one of the individual submitting the mail pieces and the creator of the mail pieces.

17. The method of claim 16, wherein the step of capturing and recording the identity of an individual comprises the step of recording at least one physical characteristic of the individual.

18. The method of claim 11, wherein the source tracing code on the mail pieces is independent from a meter imprint, digital postage mark or postal indicia.

19. A method for providing traceability of mail pieces, comprising the steps of:

receiving at least one mail piece and a mailing statement at a postal service facility;

capturing and storing the identity of an individual submitting the at least one mail piece;

providing a source tracing code on the at least one mail piece and the mailing statement via source tracing code producing equipment, after the at least one mail piece and the mailing statement has been submitted to the postal facility, the source tracing code on the at least one mail piece corresponding to the source tracing code on the mailing statement; and storing information produced by the source tracing code producing equipment in association with the captured and stored identity of the individual submitting the at least one mail piece and the mailing statement;

wherein the identity of the individual is identified directly by reading the source tracing code on the at least one mail piece without accessing the mailing statement.

20. The method of claim 19, wherein the step of capturing and storing the identity of an individual comprises the step of recording at least one physical characteristic of the individual submitting the at least one mail piece via recording equipment.

21. The method of claim 20, wherein the recording equipment comprises camera equipment, video equipment, finger print equipment or retina scan equipment.

22. A method for providing traceability of mail pieces, comprising the steps of:

providing a tracing code corresponding to a mail producer;

marking at least one envelope with the tracing code to produce at least one mail piece;

marking a mailing statement for the at least one envelope with a corresponding tracing code;

recording the identity of the mail producer in association with the tracing code;

receiving the at least one mail piece at a postal service facility; and reading the tracing code on the at least one mail piece and the corresponding tracing code on the mailing state ment to verify the mail producer, wherein the mail producer is identified directly by reading the tracing code on the at least one envelope without accessing the mailing statement.

23. The method of claim 22, further comprising the steps of:

capturing and storing the identity of an individual submitting the at least one mail piece to the postal facility in association with the encrypted tracing code; and subsequently using the encrypted tracing code to trace the at least one mail piece back to the individual.

24. The method of claim 22, further comprising the step of tracing the tracing code back to the mail producer.

25. The method of claim 22, further comprising the step of providing an alert indication when the mailer cannot be verified.

* * * * *